(12) United States Patent
Ehrenpfordt et al.

(10) Patent No.: US 9,269,831 B2
(45) Date of Patent: Feb. 23, 2016

(54) MICROMECHANICAL FUNCTIONAL APPARATUS, PARTICULARLY A LOUDSPEAKER APPARATUS, AND APPROPRIATE METHOD OF MANUFACTURE

(71) Applicant: Robert Bosch GmbH, Stuttgart (DE)

(72) Inventors: Ricardo Ehrenpfordt, Korntal-Muenchingen (DE); Mathias Bruendel, Stuttgart (DE); Andre Gerlach, Leonberg-Hoefingen (DE); Christina Leinenbach, Karlsruhe (DE); Sonja Knies, Rutesheim (DE); Ando Feyh, Palo Alto, CA (US); Ulrike Scholz, Korntal (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/680,773

(22) Filed: Nov. 19, 2012

(65) Prior Publication Data

US 2013/0126991 A1 May 23, 2013

(30) Foreign Application Priority Data

Nov. 21, 2011 (DE) .......................... 10 2011 086 722

(51) Int. Cl.
| | |
|---|---|
| H01L 29/84 | (2006.01) |
| H01L 29/66 | (2006.01) |
| H04R 19/00 | (2006.01) |
| B81B 7/00 | (2006.01) |
| H04R 19/02 | (2006.01) |
| H04R 31/00 | (2006.01) |
| H04R 1/02 | (2006.01) |
| H04R 1/06 | (2006.01) |

(52) U.S. Cl.
CPC .............. *H01L 29/84* (2013.01); *B81B 7/0061* (2013.01); *H01L 29/66007* (2013.01); *H04R 19/005* (2013.01); *H04R 19/02* (2013.01); *H04R 31/006* (2013.01); *B81B 2201/0257* (2013.01); *H04R 1/023* (2013.01); *H04R 1/06* (2013.01); *H04R 2201/003* (2013.01)

(58) Field of Classification Search
CPC .............................................. B81B 2201/0257
USPC .............. 257/415–416, E29.324; 438/50–53; 381/111–117, 360
See application file for complete search history.

(56) References Cited

U.S. PATENT DOCUMENTS 4,885,781 A * 12/1989 Seidel ........................... 381/351
5,739,585 A * 4/1998 Akram et al. ................. 257/698

(Continued)

FOREIGN PATENT DOCUMENTS

DE     10 2005 055 478 A1     5/2007

*Primary Examiner* — Robert Huber
*Assistant Examiner* — Gardner W Swan
(74) *Attorney, Agent, or Firm* — Maginot, Moore & Beck LLP

(57) ABSTRACT

A micromechanical functional apparatus, particularly a loudspeaker apparatus, includes a substrate having a top and an underside and at least one circuit chip mounted on the underside in a first cavity. The apparatus further includes a micromechanical functional arrangement, particularly a loudspeaker arrangement, having a plurality of micromechanical loudspeakers mounted on the top in a second cavity. A covering device is mounted above the micromechanical functional arrangement on the top. An appropriate method is implemented to manufacture the micromechanical functional apparatus.

18 Claims, 2 Drawing Sheets

(56) References Cited

U.S. PATENT DOCUMENTS

| | | | |
|---|---|---|---|
| 5,780,926 A * | 7/1998 | Seo | 257/676 |
| 6,558,966 B2 * | 5/2003 | Mess et al. | 438/15 |
| 7,166,910 B2 * | 1/2007 | Minervini | 257/704 |
| 8,199,939 B2 * | 6/2012 | Suvanto | H04R 19/005 381/175 |
| 8,229,139 B2 * | 7/2012 | Pahl | 381/150 |
| 8,618,619 B1 * | 12/2013 | Miks et al. | 257/414 |
| 2004/0130728 A1 * | 7/2004 | Degertekin et al. | 356/505 |
| 2007/0130547 A1 * | 6/2007 | Boillot | 715/863 |
| 2008/0164545 A1 * | 7/2008 | Hsiao | 257/416 |
| 2008/0217709 A1 * | 9/2008 | Minervini et al. | 257/416 |
| 2009/0140413 A1 * | 6/2009 | Wang et al. | 257/698 |
| 2011/0150261 A1 * | 6/2011 | Ho et al. | 381/361 |
| 2012/0250897 A1 * | 10/2012 | Michel et al. | 381/111 |
| 2013/0343590 A1 * | 12/2013 | Nakagawa et al. | 381/361 |

\* cited by examiner

MICROMECHANICAL FUNCTIONAL APPARATUS, PARTICULARLY A LOUDSPEAKER APPARATUS, AND APPROPRIATE METHOD OF MANUFACTURE

This application claims priority under 35 U.S.C. §119 to patent application no. DE 10 2011 086 722.8, filed on Nov. 21, 2011 in Germany, the disclosure of which is incorporated herein by reference in its entirety.

BACKGROUND

The disclosure relates to a micromechanical functional apparatus, particularly a loudspeaker apparatus, and to an appropriate method of manufacture.

Although it is actually possible to use any micromechanical functional apparatuses, the present disclosure and the underlying problems are explained with reference to silicon-based micromechanical loudspeaker apparatuses.

In comparison with microphone or pressure sensor packages, which need to provide media access to the diaphragm, a front volume and possibly a back volume in a small installation space, a package for MEMS loudspeaker apparatuses should provide a suitable acoustic window, in particular.

MEMS-based loudspeakers usually consist of a relatively large MEMS chip which has an arrangement of individual loudspeakers having respective diaphragms, wherein the respective diaphragms can be deflected on both sides by adjacently arranged perforated electrodes.

DE 10 2005 055 478 A1 discloses a micromechanical structure for receiving and/or producing acoustic signals in a medium which at least partially surrounds the structure. The structure has a diaphragm which is essentially closed and which essentially forms a first side of the structure, and also a mating element and a closed substrate which is provided on a second side, which is opposite the first side. The mating element is provided between the diaphragm and the substrate.

SUMMARY

The disclosure provides a micromechanical functional apparatus, particularly a loudspeaker apparatus, and an appropriate method of manufacture.

Preferred developments are the subject matter of the respective subclaims.

The disclosure provides a micromechanical functional apparatus having a three-dimensional substrate, e.g. a PCB substrate. A cover is provided preferably by laminating a film onto the substrate above the functional arrangement.

The three-dimensional substrate has at least two cavities which are remote from one another, wherein the cavity for holding the ASIC circuit chip is advantageously arranged centrally beneath the cavity for the MEMS functional arrangement. The cavities can be capped or filled in following the chip mounting. Since the cavities for holding the chips are produced on remote sides, the chips can be mounted more or less above one another despite severely differing chip sizes, which means that the area requirement is significantly reduced in comparison with side-by-side mounting.

Preferably, a multilayer printed circuit board is used as the three-dimensional substrate, the manufacturing process therefor involving at least partially prepunched, predrilled or premilled printed circuit board levels (core layers) being laminated onto one another. In this context, the substrate provides not only the redistribution and the plated-through holes (vias) but also expediently the cavities for chip mounting. This dispenses with complex process sequences in the packaging process (construction and connection technique), such as fitting spacers, fitting a housing frame, etc. The packaging process is therefore reduced to chip mounting and laminating on the acoustically permeable cover, and also singularizing the loudspeaker packages from the printed circuit board assemblage.

This results in the following significant advantages.

Since the ASIC circuit chip is mounted beneath the MEMS loudspeaker arrangement in the three-dimensional substrate, there is a significant reduction in the footprint in comparison with a classical side-by-side construction. In addition, this allows the chips, which are typically very different in size (MEMS loudspeaker arrangement 10×10 mm2, ASIC circuit chip 4×4 mm2), to be stacked without additional complexity, i.e. there is no need for spacers to be fitted serially.

A central arrangement of the ASIC circuit chip beneath the MEMS loudspeaker arrangement allows the conductor tracks to be laid out symmetrically and with extremely short lengths. This has a particularly advantageous effect on the parasitic behavior. As a result of the separation of the ASIC circuit chip and the MEMS functional arrangement on different sides, less film is required for sealing the MEMS functional arrangement cavity. Furthermore, no acoustic imbalances are produced. Since the MEMS functional arrangement and the ASIC circuit chip are mounted on substrate sides which are remote from one another, hybrid packaging can be used without reservation, i.e. the ASIC circuit chip can be soldered as a flip chip without contaminating the wire bonds for the MEMS mounting or, when the MEMS functional arrangement has been mounted previously, without contaminating the diaphragms thereof.

In addition, there is a reduction in the footprint in comparison with a package with individual, i.e. serially fitted, caps, since shorter distances between the chips and the edge of the package need to be observed in the substrate than when a cap is used. Furthermore, the contact spacing can be of narrower design, since the modules are separated from one another by sawing and it is not necessary to make any allowance for the cap.

When a printed circuit board is used, it is possible to cap the package by laminating on an acoustically permeable film using the batch method, i.e. it is not necessary to perform a serial capping process (positioning the individual frames and laminating on the film). This significantly reduces the costs of manufacture.

Since, in the case of a loudspeaker arrangement, the back volumes are integrated into the substrate, some of the functionality can be relocated from the MEMS loudspeaker arrangement to the inexpensive printed circuit board. Since a large portion of the back volumes is provided in the package, it is possible to reduce the chip thickness of the MEMS loudspeaker arrangement. This reduces the costs of manufacture of the MEMS loudspeaker arrangement, since the trench process is more expensive with a chip thickness of 400 µm, for example, than with a chip thickness of 200 µm, for example. Alternatively, if the chip thickness of the MEMS loudspeaker arrangement is unaltered, it is possible to enlarge the back volume inexpensively. This results in a maximum back volume for a reduced physical size (physical height, footprint) of the package. The disclosure therefore provides a robust package in terms of reliability and the fitting process for consumers.

BRIEF DESCRIPTION OF THE DRAWINGS

Further features and advantages of the present disclosure are explained below using embodiments with reference to the figures, in which.

DETAILED DESCRIPTION

In the figures, the same reference symbols denote elements which are the same or which have the same function.

Figure 1:
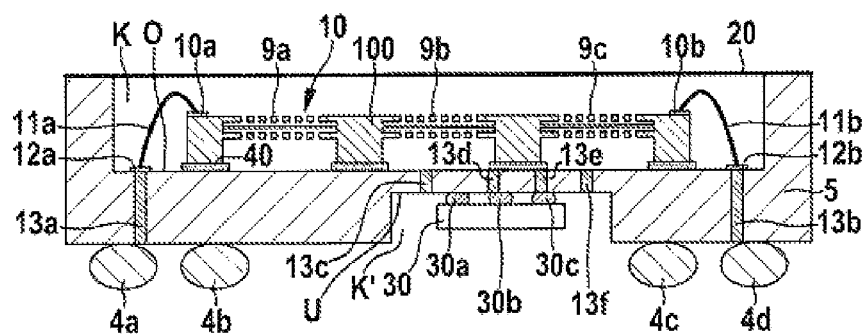
FIG. 1 shows a schematic cross-sectional view to explain a micromechanical loudspeaker apparatus and an appropriate method of manufacture according to a first embodiment of the present disclosure.

FIG. 1 is a schematic cross-sectional view to explain a micromechanical loudspeaker apparatus and an appropriate method of manufacture according to a first embodiment of the present disclosure.

In FIG. 1, reference symbol 5 denotes a three-dimensional printed circuit board. The underside U of the printed circuit board 5 has a first cavity K', and the top O of said printed circuit board has a second cavity K.

The first cavity K' contains an ASIC circuit chip 30 connected by means of solder joints 30a, 30b, 30c to a redistribution element (not shown) and to plated-through holes 13c, 13d, 13e and 13f in the printed circuit board 5. The plated-through holes 13c, 13d, 13e, 13f electrically connect the underside U of the printed circuit board 5 to the top O of the printed circuit board 5.

The top O of the printed circuit board 5 in the second cavity K also has a redistribution device (not shown). In the second cavity K, an MEMS loudspeaker arrangement 10 having a multiplicity of loudspeakers 9a, 9b, 9c is mounted, for example by means of adhesive bonding using an adhesive layer 40. The loudspeakers 9a, 9b, 9c are clamped in respective frame elements 100 and have a diaphragm between two perforated electrodes. Reference symbols 10a, 10b denote electrical connections of the MEMS loudspeaker arrangement 10. The electrical connections 10a, 10b are connected by means of respective bonding wires 11a, 11b to connection areas 12a, 12b in the second cavity K next to the MEMS loudspeaker arrangement.

The connection areas 12a, 12b in turn are connected by plated-through holes 13a, 13b to solder ball connection areas 4a and 4d on the underside U of the printed circuit board 5. Further solder ball connection areas are denoted by reference symbols 4b and 4c. The MEMS loudspeaker arrangement 10 is held completely in the second cavity K and is capped by an acoustically conductive film 20 which is laminated onto a peripheral area of the printed circuit board 5. The ASIC circuit chip 30 is likewise held completely in the first cavity K', so that solder mounting on a further substrate (not shown) is possible without difficulty.

The acoustically permeable film preferably consists of Mylar, Teflon, Kapton and the like. It performs the function of an acoustic window. In addition, it protects the sensitive loudspeaker arrangement 10 with its diaphragms and electrodes from dust.

The loudspeaker arrangement 10 shown is preferably not manufactured separately but rather is manufactured using the batch method and is singularized following completion by sawing. A fundamental advantage in this context is that the film 20 that is permeable to sound does not need to be mounted on each loudspeaker apparatus 10 separately, but rather can be mounted on a multiplicity of loudspeaker apparatuses in a single step.

Figure 2:
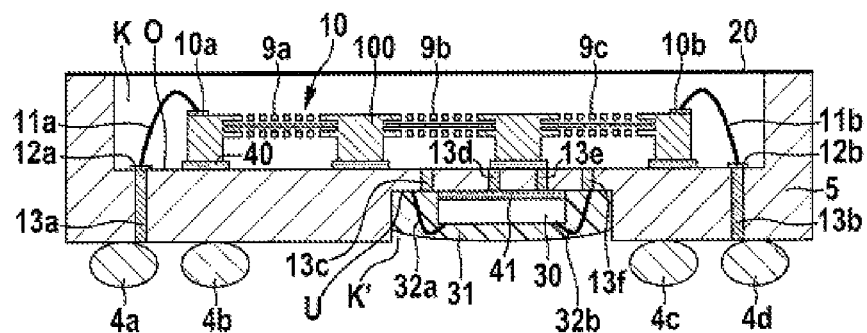
FIG. 2 shows a schematic cross-sectional view to explain a micromechanical loudspeaker apparatus and an appropriate method of manufacture according to a second embodiment of the present disclosure.

FIG. 2 is a schematic cross-sectional view to explain a micromechanical loudspeaker apparatus and an appropriate method of manufacture according to a second embodiment of the present disclosure.

In the case of the second embodiment, the ASIC circuit chip 30 is not mounted using the flip-chip method as in the case of the first embodiment, but rather is mounted in the first cavity K' by means of an adhesive layer 41. In this embodiment, an electrical connection for the ASIC circuit chip 30 is made by means of bonding wires 32a, 32b, which are electrically connected to the redistribution device (not shown) and the plated-through holes 13c-f in the first cavity K'.

Reference symbol 31 denotes a potting compound which is used to seal the ASIC circuit chip 30 and its bonding wires 32a, 32b, the potting compound 31 essentially filling the entire first cavity K' without protruding over the underside U of the printed circuit board 5. Otherwise, the second embodiment is of similar design to the first embodiment. The potting compound 31 is preferably a gel or a plastic compound.

Figure 3:
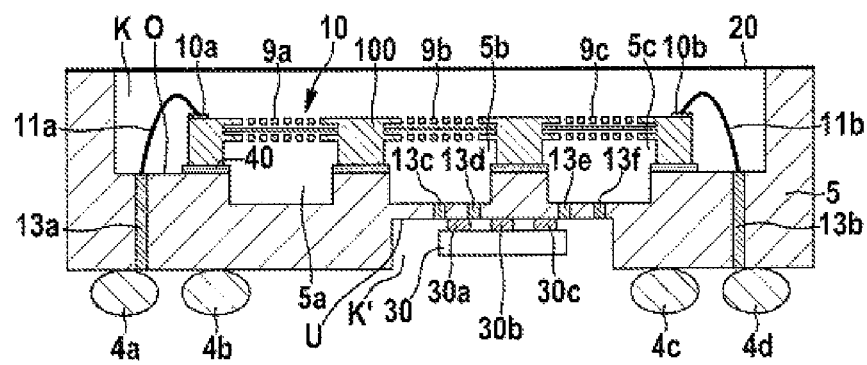
FIG. 3 shows a schematic cross-sectional view to explain a micromechanical loudspeaker apparatus and an appropriate method of manufacture according to a third embodiment of the present disclosure.

FIG. 3 is a schematic cross-sectional view to explain a micromechanical loudspeaker apparatus and an appropriate method of manufacture according to a third embodiment of the present disclosure.

In the case of the embodiment shown in FIG. 3, in comparison with the first embodiment described above which is shown in FIG. 1, additional back volumes 5a, 5b, 5c are provided in the printed circuit board 5 which are arranged beneath the respective loudspeakers 9a, 9b, 9c. Otherwise, the third embodiment is of similar design to the first embodiment.

Figure 4:
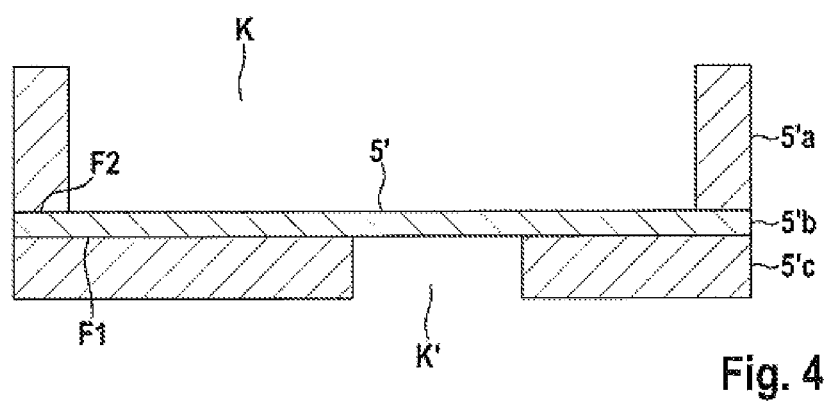
FIG. 4 shows a schematic cross-sectional view to explain a laminated printed circuit board substrate for use in the first and second embodiments of the present disclosure.

FIG. 4 is a schematic cross-sectional view to explain a laminated printed circuit board substrate for use in the first and second embodiments of the present disclosure.

As FIG. 4 shows, the substrate 5' has a printed circuit board laminate comprising three printed circuit boards 5'a, 5'b, 5'c, which are connected at joint faces F1, and F2.

Although the present disclosure has been described with reference to preferred exemplary embodiments, it is not limited thereto. In particular, the cited materials and topologies are merely exemplary and are not limited to the examples which have been explained.

In the exemplary embodiments presented, the packages were in the form of Ball Grid Arrays (BGA). It goes without saying that it is likewise possible to provide a version in the form of Land Grid Arrays (LGA). Instead of the printed circuit board as a substrate, it is also possible to use a three-dimensional ceramic. In the embodiments illustrated above, the arrangement of the ASIC circuit chip on the underside of the substrate is essentially central, i.e. essentially symmetrical beneath the MEMS loudspeaker arrangement. This has a positive influence on parasitic effects, but is not absolutely necessary, particularly if the printed circuit board is of adequate thickness.

What is claimed is:

1. A micromechanical functional apparatus, comprising:
   a printed circuit board having a top and an underside, the top having a top surface, the underside having an underside surface, the underside defining a first cavity that is recessed from the underside surface toward the top, the top defining a second cavity that is recessed from the top surface toward the underside;
   at least one circuit chip mounted within the first cavity;

a micromechanical functional arrangement having a plurality of micromechanical loudspeakers mounted within the second cavity; and a covering device mounted to the top surface of the printed circuit board above the micromechanical functional arrangement, wherein the at least one circuit chip is electrically connected to the micromechanical functional arrangement through a portion of the printed circuit board located between the first cavity and the second cavity.

2. The micromechanical functional apparatus according to claim 1, wherein the micromechanical functional arrangement is adhesively bonded to the printed circuit board within the second cavity.

3. The micromechanical functional apparatus according to claim 1, wherein the micromechanical functional arrangement is a loudspeaker arrangement having the plurality of micromechanical loudspeakers,
wherein the printed circuit board has a plurality of cutouts defined within the second cavity which corresponds to the plurality of loudspeakers, and
wherein the micromechanical loudspeaker arrangement is mounted on the printed circuit board within the second cavity such that the cutouts form respective rear volumes of the loudspeakers.

4. The micromechanical functional apparatus according to claim 1,
wherein the first cavity is arranged directly below the second cavity within the printed circuit board,
wherein a portion of the printed circuit board is interposed between the first cavity and the second cavity,
wherein the printed circuit board defines one or more electrical plated-through holes which extend through the portion of the printed circuit board between the first cavity and the second cavity and electrically connect the at least one circuit chip and the micromechanical functional arrangement.

5. The micromechanical functional apparatus according to claim 4, wherein electrical connections of the functional arrangement are bonded by respective bonding wires to bonding pads which are provided on the top in the second cavity and are in electrical contact with respective plated-through holes.

6. The micromechanical functional apparatus according claim 1, wherein the circuit chip is flip-chip mounted in the first cavity.

7. The micromechanical functional apparatus according to claim 1, wherein bonding wires are used to make electrical contact with the circuit chip in the first cavity.

8. The micromechanical functional apparatus according to claim 1, wherein the circuit chip is embedded in a potting compound in the first cavity.

9. The micromechanical functional apparatus according to claim 1, wherein the covering device is a film.

10. The micromechanical functional apparatus according to claim 1, wherein the printed circuit board has a laminate structure.

11. The micromechanical functional apparatus according to claim 1, wherein the underside of the printed circuit board has an electrical contact-connection device which is electrically connected to the functional arrangement by plated-through holes which extend through the printed circuit board between the first cavity and the second cavity.

12. The micromechanical functional apparatus of claim 1, wherein the micromechanical functional apparatus is a loudspeaker apparatus, and wherein the micromechanical functional arrangement is a loudspeaker arrangement.

13. The micromechanical functional apparatus of claim 1,
wherein the printed circuit board is formed by a plurality of printed circuit board layers laminated onto one another to form a laminate structure,
wherein at least one of the printed circuit board layers on the top of the laminate structure defines the second cavity, and
wherein at least one of the printed circuit board layers on the underside of the laminate structure defines the first cavity.

14. A method for manufacturing a micromechanical functional apparatus, comprising:
mounting at least one circuit chip in a first cavity of a printed circuit board having an underside that defines the first cavity and a top that defines a second cavity, the first cavity being recessed from the underside of the printed circuit board, the second cavity being recessed from the top of the printed circuit board;
mounting a micromechanical functional arrangement having a plurality of micromechanical loudspeakers in the second cavity;
electrically connecting the at least one circuit chip to the micromechanical functional arrangement through a portion of the printed circuit board located between the first cavity and the second cavity; and
mounting a covering device above the micromechanical functional arrangement on the top.

15. The method according to claim 14, wherein the circuit chip is flip-chip mounted in the first cavity.

16. The method according to claim 14, wherein the circuit chip is embedded in a potting compound in the first cavity.

17. The method according to claim 14, wherein electrical connections of the functional arrangement are bonded by respective bonding wires to bonding pads which are provided on the top in the second cavity and are in electrical contact with respective plated-through holes which extend through the printed circuit board between the first cavity and the second cavity.

18. The method according to claim 14, wherein the micromechanical functional apparatus is a loudspeaker apparatus, and wherein the micromechanical functional arrangement is a loudspeaker arrangement.

* * * * *